United States Patent
Holman

(10) Patent No.: US 7,199,527 B2
(45) Date of Patent: Apr. 3, 2007

(54) DISPLAY DEVICE AND METHODS OF MANUFACTURING AND CONTROL

(75) Inventor: Andrew W. Holman, West Hills, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 10/442,511

(22) Filed: May 21, 2003

(65) Prior Publication Data

US 2003/0214229 A1 Nov. 20, 2003

Related U.S. Application Data

(63) Continuation of application No. PCT/US01/43323, filed on Nov. 21, 2001.

(60) Provisional application No. 60/252,247, filed on Nov. 21, 2000.

(51) Int. Cl.
*G09G 3/10* (2006.01)
(52) U.S. Cl. .............................. 315/169.1; 315/169.3; 349/151; 345/100; 345/103; 313/511
(58) Field of Classification Search ................ 345/107, 345/22, 36–42, 87, 92, 93, 98, 100, 103; 313/500, 504–506, 502, 511, 516, 494, 521, 313/517; 445/1, 67; 156/655.1; 315/169.1–169.3; 438/612, 618, 637, 667; 349/86, 143, 147, 349/158, 149–151
See application file for complete search history.

(56) References Cited

U.S. PATENT DOCUMENTS

| | | | |
|---|---|---|---|
| 4,352,040 A | * | 9/1982 | Andreadakis ................ 313/584 |
| 4,478,769 A | | 10/1984 | Pricone et al. |
| 4,511,926 A | | 4/1985 | Crossland et al. |
| 4,601,861 A | | 7/1986 | Pricone et al. |
| 4,633,567 A | | 1/1987 | Montalbano |
| 4,839,634 A | * | 6/1989 | More et al. ................. 345/173 |
| 4,982,183 A | | 1/1991 | Flegal et al. |
| 5,062,916 A | | 11/1991 | Aufderheide et al. |
| 5,223,321 A | | 6/1993 | Sinnadurai et al. |
| 5,440,322 A | | 8/1995 | Prince et al. |

(Continued)

FOREIGN PATENT DOCUMENTS

EP 0478381 4/1992

(Continued)

*Primary Examiner*—Haiśa Philogene
(74) *Attorney, Agent, or Firm*—Blakely, Sokoloff, Taylor & Zafman LLP

(57) ABSTRACT

A flexible display device has one or more flexible electrode assemblies. Each of the electrode assemblies includes a hierarchical control arrangement for selectively activating electrodes of the display device. The hierarchical control arrangement includes high-level control elements and low-level control elements, each of the high-level control elements being operatively coupled to respective subsets of the low-level control elements, which in turn are coupled to respective groups of the electrodes. Exemplary control elements are microstructure elements containing imbedded microprocessors or integrated circuits. The use of a hierarchical control arrangement results in data signals having to pass through fewer control elements when compared with single-level arrangements. This increases operation speed and reduces power losses due to voltage drops across control elements. In addition, the number of connections to device(s) external to the display may thereby be reduced.

19 Claims, 7 Drawing Sheets

U.S. PATENT DOCUMENTS

| | | | |
|---|---|---|---|
| 5,475,402 A | 12/1995 | Hijikata | |
| 5,481,651 A | 1/1996 | Herold | |
| 5,525,867 A * | 6/1996 | Williams | 315/169.3 |
| 5,545,291 A | 8/1996 | Smith et al. | |
| 5,625,477 A | 4/1997 | Wu et al. | |
| 5,661,371 A * | 8/1997 | Salerno et al. | 315/169.3 |
| 5,661,533 A | 8/1997 | Wu et al. | |
| 5,703,436 A | 12/1997 | Forrest et al. | |
| 5,726,726 A | 3/1998 | Nakanishi | |
| 5,783,856 A | 7/1998 | Smith et al. | |
| 5,796,454 A | 8/1998 | Ma | |
| 5,824,186 A | 10/1998 | Smith et al. | |
| 5,825,451 A | 10/1998 | Ma et al. | |
| 5,831,588 A | 11/1998 | Hotto | |
| 5,889,566 A | 3/1999 | Wu et al. | |
| 5,904,545 A | 5/1999 | Smith et al. | |
| 5,930,041 A | 7/1999 | Thielman | |
| 5,933,203 A | 8/1999 | Wu et al. | |
| 5,949,513 A | 9/1999 | Ma et al. | |
| 5,965,280 A | 10/1999 | Roitman et al. | |
| 6,020,941 A | 2/2000 | Ma | |
| 6,067,016 A | 5/2000 | Deschenes et al. | |
| 6,104,448 A * | 8/2000 | Doane et al. | 349/12 |
| 6,130,657 A | 10/2000 | Kurokawa et al. | |
| 6,146,225 A * | 11/2000 | Sheats et al. | 445/24 |
| 6,177,921 B1 * | 1/2001 | Comiskey et al. | 345/107 |
| 6,225,992 B1 | 5/2001 | Hsu et al. | |
| 6,274,508 B1 * | 8/2001 | Jacobsen et al. | 438/758 |
| 6,359,669 B1 * | 3/2002 | Dehmlow | 349/62 |
| 6,636,185 B1 * | 10/2003 | Spitzer et al. | 345/8 |
| 6,853,360 B1 * | 2/2005 | Webb | 345/87 |
| 6,879,096 B1 * | 4/2005 | Miyazaki et al. | 313/495 |
| 2004/0004609 A1 * | 1/2004 | Holman | 345/211 |

FOREIGN PATENT DOCUMENTS

| | | |
|---|---|---|
| GB | 2327137 | 5/1998 |
| WO | WO 02/43044 | 5/1992 |
| WO | WO 00/46854 A1 | 8/2000 |
| WO | WO 00/49421 A1 | 8/2000 |
| WO | WO 00/49658 A1 | 8/2000 |
| WO | WO 00/55915 A1 | 9/2000 |
| WO | WO 00/55916 A1 | 9/2000 |
| WO | WO 02/43032 | 5/2002 |

* cited by examiner

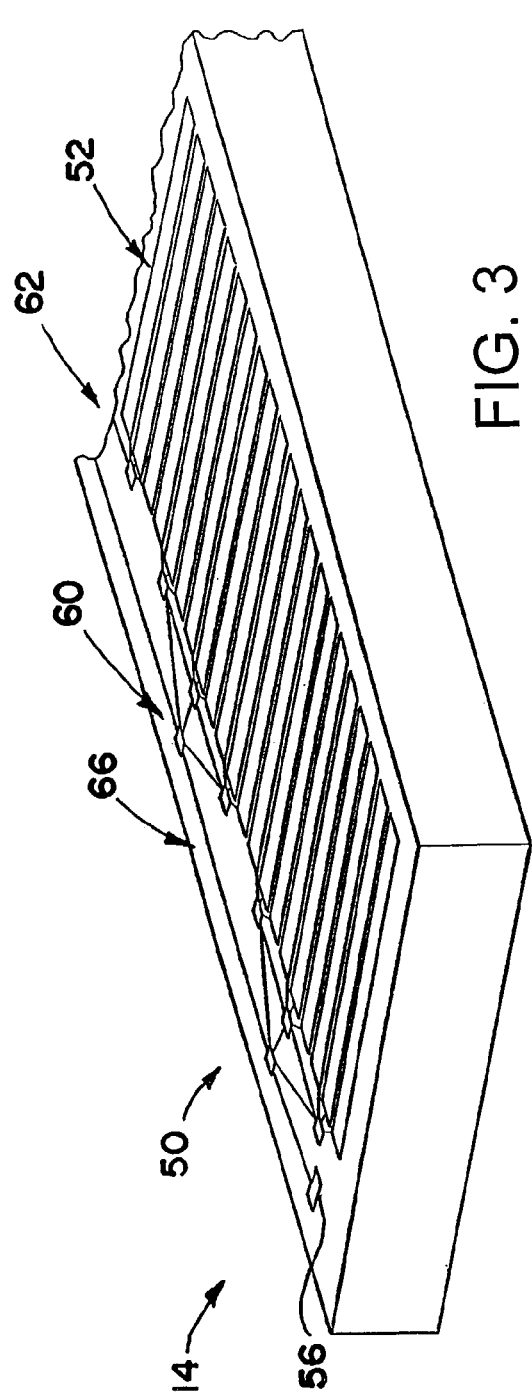
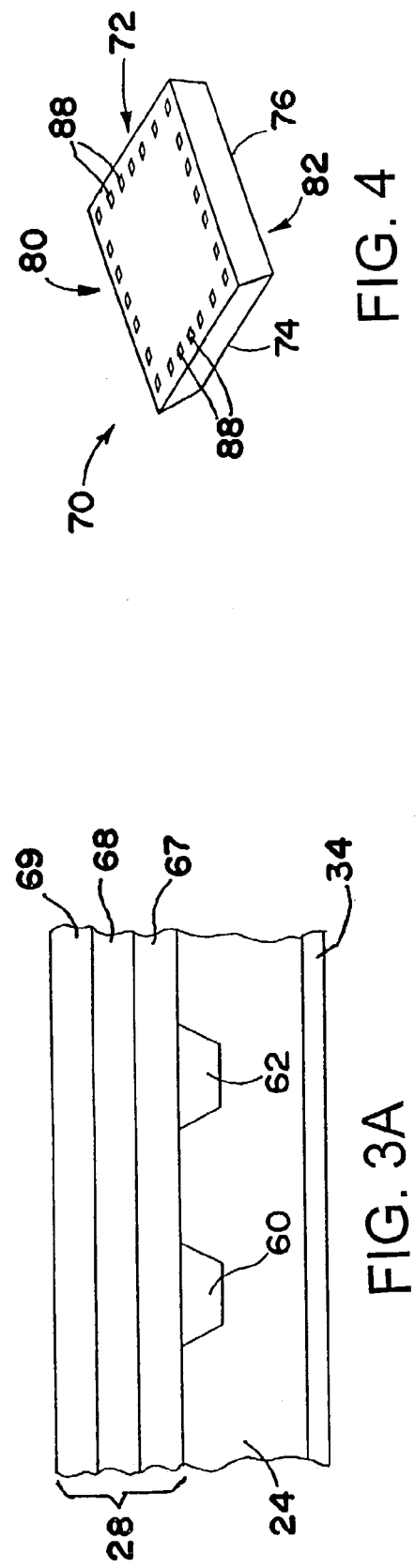
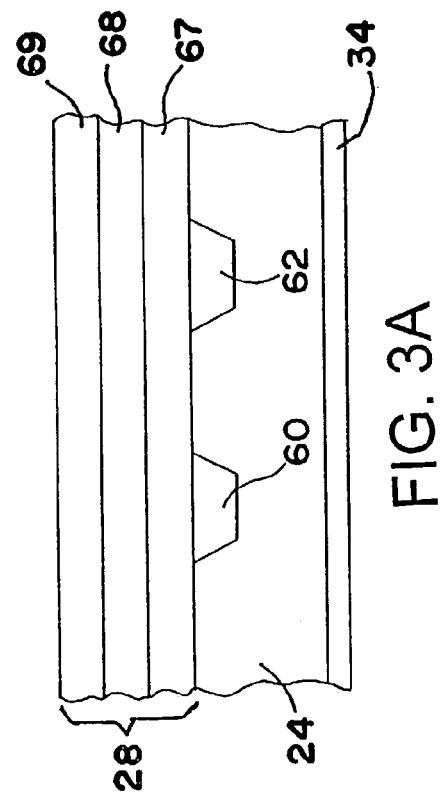

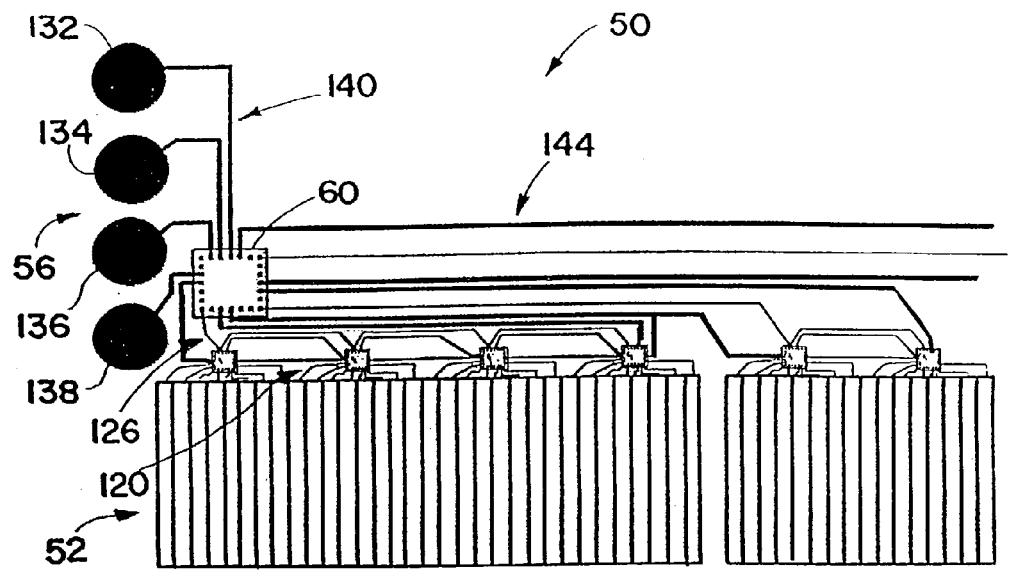
FIG. 7
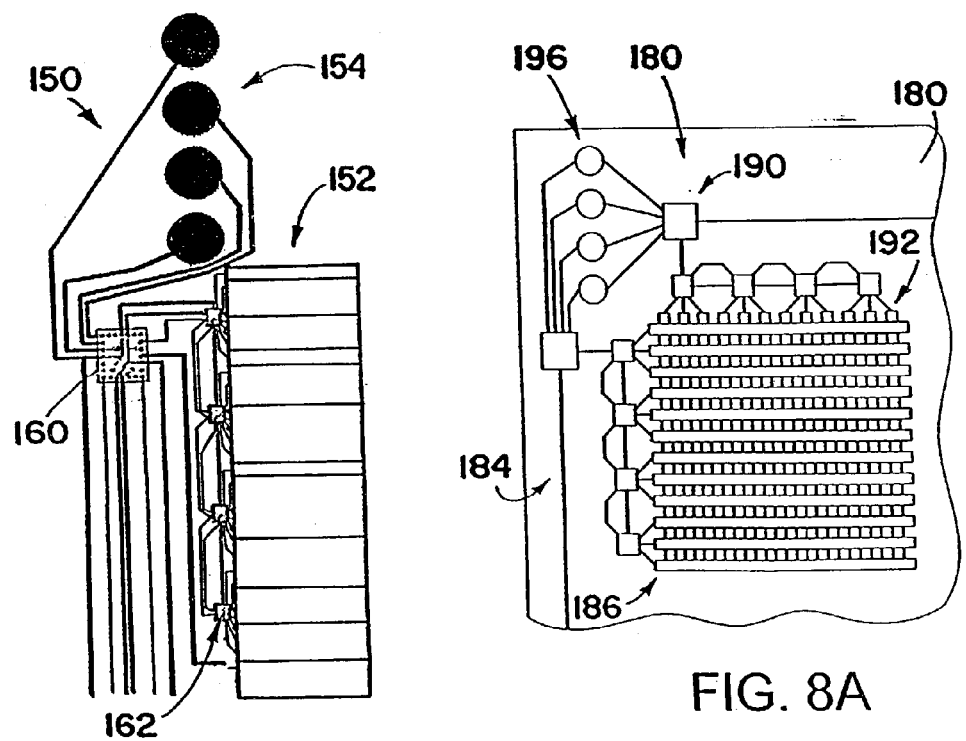
FIG. 8
FIG. 8A

DISPLAY DEVICE AND METHODS OF MANUFACTURING AND CONTROL

This application is a continuation of PCT Application No. PCT/US01/43323, filed Nov. 21, 2001, which was published in English, as WO 02/43032, which claims the benefit of U.S. Provisional Application No. 60/252,247, filed Nov. 21, 2000. All of the above applications are incorporated herein by reference in their entireties.

BACKGROUND OF THE INVENTION

1. Technical Field of the Invention

The invention relates to arrangements for selectively providing power to one or more of a plurality of electrodes, and to devices including such arrangements. More particularly, the invention relates to display devices and means or methods for selectively providing power to one or more electrodes of such devices.

2. Background of the Related Art

Liquid crystal display devices operate by placing an electric field across portions of a liquid crystal material in order to locally alter the light transmissibility of the material. Electrodes are placed on opposite sides of the material. The electrodes may include arrays of row on column electrodes on respective sides of the material, a pixel of the display being operated by selectively supplying or withholding power to the row and column electrodes corresponding to the pixel. Alternatively, there may be electrodes on one side the material, corresponding to respective of the pixels, with the opposite side of the material having a single large electrode. The pixels are operated by selectively supplying or withholding power from the corresponding electrode.

Making connections to the electrodes to enable selective activation of the electrodes may involve complicated structures which are difficult and expensive to fabricate. In addition, there is increased interest in faster, low-power displays, for example for use in displaying video in portable devices.

From the foregoing it will be appreciated that a need exists for improved display devices.

SUMMARY OF THE INVENTION

A flexible display device has one or more flexible electrode assemblies. Each of the electrode assemblies includes a hierarchical control arrangement for selectively activating electrodes of the display device. The hierarchical control arrangement includes high-level control elements and low-level control elements, each of the high-level control elements being operatively coupled to respective subsets of the low-level control elements, which in turn are coupled to respective groups of the electrodes. Exemplary control elements are microstructure elements containing imbedded microprocessors or integrated circuits. The use of a hierarchical control arrangement results in data signals having to pass through fewer control elements when compared with single-level arrangements. This increases operation speed and reduces power losses due to voltage drops across control elements. In addition, the number of connections to device(s) external to the display may thereby be reduced.

According to an aspect of the invention, a display includes a plurality of electrodes; and a multilevel, hierarchical control arrangement for selectively providing power to one or more the electrodes, the control arrangement including a plurality of low-level control elements connected to respective of the electrodes, and a plurality of high-level control elements operatively configured to be coupled to a power source and a reference voltage source or ground, wherein each of the high-level control elements is coupled to a respective subset of the low-level control elements.

According to another aspect of the invention, a method for selectively activating one of a plurality of electrodes of a display, includes the steps of sending a data signal through high-level control elements of a multilevel, hierarchical control arrangement, the data signal corresponding to one of the high-level control elements; routing the data signal through a subset of a plurality of low-level control elements, the subset of the low-level elements corresponding to and operatively coupled to the one of the high-level control elements, the data signal corresponding to one of the subset of the low-level elements; and activating the electrode, which is connected to the one of the subset of the low-level elements.

According to yet another aspect of the invention, a flexible display includes first and second flexible electrode assemblies on opposite sides of a layer of display material, wherein the first electrode assembly includes a plurality of row electrodes and the second electrode assembly includes a plurality of column electrodes.

According to another aspect of the invention, a flexible display includes a flexible substrate, and a plurality of row electrodes and a plurality of column electrodes attached to the substrate with a display material between the row electrodes and the column electrodes.

According to still another aspect of the invention, a method of manufacturing a liquid crystal display includes the steps of forming on a flexible substrate a plurality electrodes and a control arrangement for selectively providing power to the electrodes, thereby forming electrode assemblies; and laminating a pair of the electrode assemblies together with a liquid crystal material therebetween, wherein one of the electrode assemblies includes a plurality of row electrodes and the other of the electrode assemblies includes a plurality of column electrodes.

According to a further aspect of the invention, a method of forming an electrode assembly includes the steps of attaching a plurality of control elements to a substrate; coupling a plurality of electrodes to the substrate; and operatively coupling the control elements to the electrodes so as to form a hierarchical control arrangement for selectively providing power to the electrodes.

According to a still further aspect of the invention, a display includes a plurality of electrodes; multiple control elements, wherein each of at least some of the control elements are operatively coupled to a respective set of the electrodes; conductive pads for external connection to provide power, ground, and signals to the display, wherein the conductive pads are operatively coupled to the control elements; and a system of conductive interconnects for operatively coupling the conductive pads to the control elements, and for operatively coupling the control elements to the electrodes, wherein the conductive interconnects do not overlap one another.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings:

FIG. 3 is a perspective view of one of the electrode assemblies of the display device of FIG. 1, conceptually illustrating its hierarchical control arrangement;

FIG. 3A is a cross-sectional view of one of the electrode assemblies of the display device of FIG. 1;

FIG. 4 is a perspective view of a microstructure element for use in the hierarchical control arrangement of FIGS. 3 and 3A;

FIGS. 6 and 7 are plan views of the connections of a column electrode arrangement of the device of FIG. 1;

FIG. 8 is a plan view of the connections of a row electrode arrangement of the device of FIG. 1;

FIG. 8A is a plan view of connections for an alternative arrangement of electrodes for the device of FIG. 1;

DETAILED DESCRIPTION

A display device includes electrodes selectively driven by a hierarchical control arrangement. The display device may be any of a variety of types of suitable display devices, such as a liquid crystal display (LCD) or an electroluminescent display. The hierarchical control arrangement includes high-level control elements and low-level control elements, each of the high-level control elements being operatively coupled to respective subsets of the low-level control elements. The control elements may be microstructure elements such as small semiconductor elements containing imbedded integrated circuits. A display with electrodes driven by a hierarchical control arrangement has many advantages over prior display devices: the hierarchical control arrangement allows driving of a larger number of pixels faster and with lower power loss; fewer external connections are required than with previous switching arrangements; and reduced tolerances in making connections allows for enhanced manufacturability.

Figure 1:
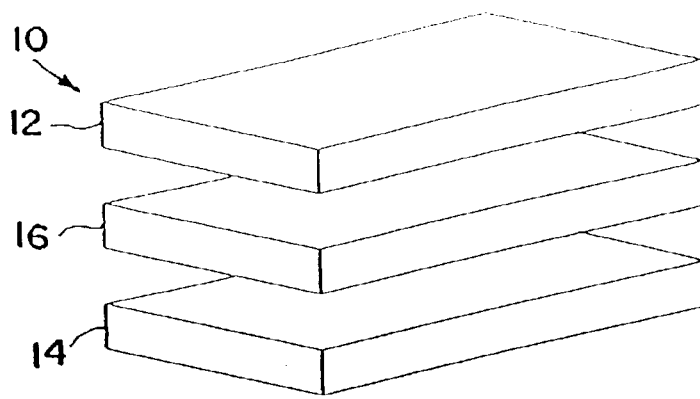
FIG. 1 is an exploded perspective view of a display device of the present invention.

Referring initially to FIG. 1, the basic structure of a display device 10 is shown. As noted above, the display device 10 may be any of a variety of types of suitable display devices, such as a liquid crystal display (LCD) or a light emitting device (LED) or electroluminescent display. The display device 10 may be any of a variety of electroluminescent displays, such as organic light emitting devices (OLEDs) or polymer light emitting devices (PLEDs). The display device 10 includes a top electrode assembly 12 and a bottom electrode assembly 14, with a material assembly 16 therebetween. The material assembly 16 includes a suitable display material that is acted on by the electrodes of the electrode assemblies 12 and 14 to achieve the desired display output. The display material may be a solid or liquid, and may be acted on by the electrodes in any of a variety of ways to achieve the desired display output. For example, the display material may be a liquid crystal material that has its crystal orientations locally or globally changed as a result of power being provided to the electrodes. Alternatively, the display material may be a light emitting material, such as an electroluminescent or light emitting material, a material that emits or does not emit light, depending on the power provided to the electrodes. The light emitting material may include multiple layers, for example including a hole transport layer, an emissive layer (also referred to as an emitter), a hole injection layer, and/or an electron transport layer. The light emitting material may include any of a variety of suitable materials, such as semiconductor materials; organic compounds such as conjugated organics or conjugated polymers that have many of the characteristics of semiconductors; and suitable polymers such as poly-paraphenylene vinylene (PPV). Further detail on suitable such materials may be found in U.S. Pat. No. 5,703,436 and in U.S. Pat. No. 5,965,280, both of which are incorporated by reference in their entireties.

The material assembly 16 may be other than a separate assembly. For example, the material assembly 16 may be a continuous or non-continuous layer of display material between the electrodes of the electrode assemblies. In addition, it will be understood that the electrodes may be formed on a single substrate, with the display material formed on the same substrate or added later.

Figure 2:
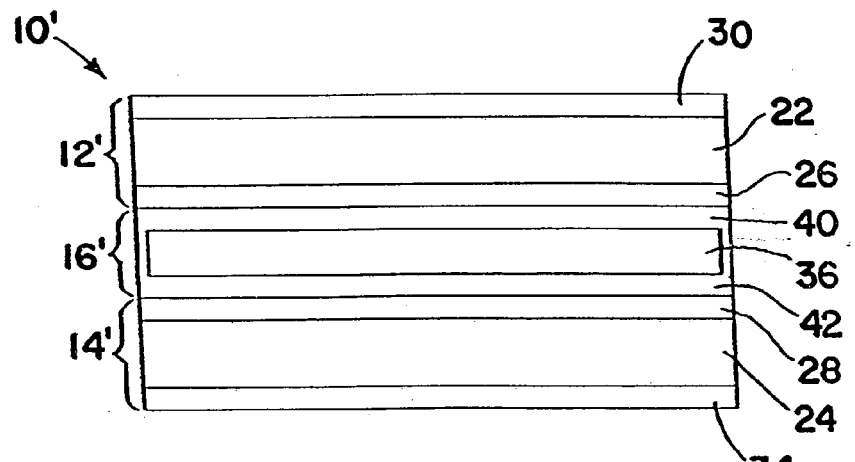
FIGS. 2 and 2A are schematic cross-sectional views of example embodiments of the display device of FIG. 1.
Figure 2A:
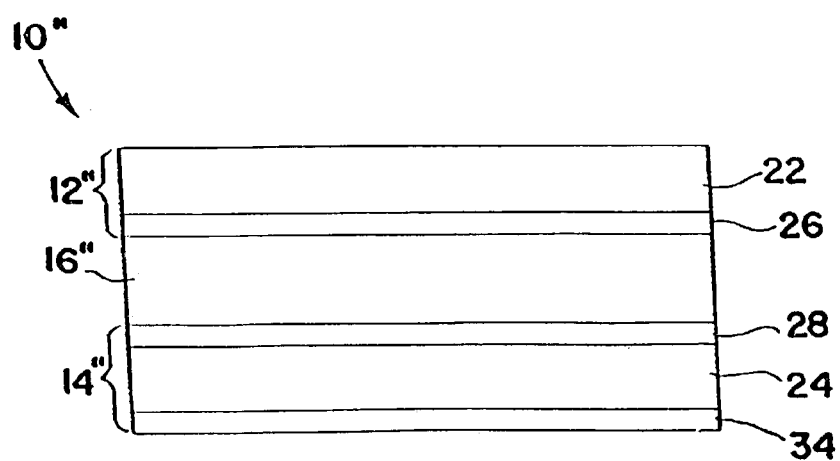

FIGS. 2 and 2A illustrate two embodiments of the display 10, a liquid crystal display 10' (FIG. 2) and an electroluminescent display 10" (FIG. 2A). Corresponding reference numbers are used for corresponding parts of the two embodiments 10' and 10".

The top and bottom electrode assemblies 12', 12" and 14', 14" include respective substrates 22 and 24, with respective electrode layers 26 and 28 on faces of the substrates. The substrates 22 and 24 may be made of any of a variety of suitable materials, for instance being made of plastic, silicon, or glass. The material for the substrates 22 and 24 may be a flexible material, such as a flexible plastic. Alternatively, the substrates 22 and 24 may be a rigid material such as glass. Examples of suitable materials include polycarbonate, polyvinyl chloride, polystyrene, polymethyl methacrylate, polyurethane polyimide, polyester, cyclic polyolefin polymers, polyether sulfone (PES), polyethylene terephthalate (PET), polyethylene naphthalate, polycarbonate, polybutylene terephthalate, polyphenylene sulfide (PPS), polypropylene, aramid, polyamide-imide (PAI), polyimide, aromatic polyimides, polyetherimide, acrylonitrile butadiene styrene, and polyvinyl chloride. Further details regarding suitable substrates and substrate materials may be found in International Publication Nos. WO 00/46854, WO 00/49421, WO 00/49658, WO 00/55915, and WO 00/55916, the entire disclosures of which are herein incorporated by reference.

As described in greater detail below, the electrode layers 26 and 28 each include electrodes, a hierarchical control arrangement for selectively providing power to the electrodes, and connections such as metal traces for operatively coupling the hierarchical control arrangement to the electrodes.

The top electrode assembly 12', for the liquid crystal display 10', may have a coating 30, for example a protective coating or an anti-reflective coating, on a face of its substrate 22 that is opposite the electrode layer 26. The bottom electrode assembly 14' may have an opaque coating, such as a black coating 34, on a face of its substrate 24 that is opposite electrode layer 28.

The liquid crystal material assembly 16' includes a liquid crystal material 36 enclosed by top and bottom boundary materials 40 and 42. The liquid crystal material 36 may be any of a large variety of suitable materials and/or additives. An exemplary suitable liquid crystal material is a zero field multistable cholesteric liquid crystal mix, such as described in U.S. Pat. No. 5,889,566, which is incorporated herein by reference. Displays including field multistable liquid crystal display (FMLCD) technology have many advantages, such as inherent stability in the display without the need to refresh the display, thus allowing a display that can maintain an image in a no-power mode; excellent sunlight readability; and fast switching operation, for example on the order of 30 milliseconds per frame; and the ability to display various gray scales.

It will be appreciated that other suitable liquid crystal materials may be employed, such as twisted nematic, super twisted nematic, double super twisted nematic, and ferroelectric materials.

An exemplary material for the boundary layers 40 and 42 is a polyimide. The boundary materials 40 and 42 are used to contain the liquid crystal material 36, and to anchor the liquid crystal material assembly 16' to the electrode assemblies 12' and 14'. The boundary materials 40 and 42 may have an index of refraction that substantially matches the corresponding index of refraction of the electrode layers 26 and 28, and/or the index of refraction of the substrates 22 and 24. The boundary materials 40 and 42 may have an alignment feature, for example being rubbed in a preselected direction or directions, to provide a pre-alignment to the liquid crystal material 36 at the boundary between the liquid crystal material and one or both of the boundary materials 40 and 42.

The material layer 16" of the electroluminescent display 10" (FIG. 2A) may include multiple layers of various materials, referred to generally as "light emitting material." For example, the material layer 16" may include a hole transport layer and/or an emitter. The material layer 16" may include any of a variety of suitable materials, such as semiconductor materials; organic compounds such as conjugated organics or conjugated polymers that have many of the characteristics of semiconductors; and suitable polymers such as polyparaphenylene vinylene (PPV). For an OLED, the hole transport material may have a thickness from 100 to 500 Angstroms, and the emitter may have a thickness from 50 to 100 Angstroms. Further detail on suitable materials may be found in U.S. Pat. No. 5,703,436 and in U.S. Pat. No. 5,965,280, both of which are incorporated by reference in their entireties.

As is conventional, one of the electrode assemblies 12 and 14 may contain row electrodes, with the other of the electrode assemblies containing column electrodes. A pixel of the device 10 may be activated by providing power to particular row and column electrodes that correspond to the pixel. This causes re-alignment of the liquid crystal material in the vicinity of the pixel, which in turn causes a change in the light transmissibility of the liquid crystal material in the vicinity of the pixel. Further details regarding a suitable arrangement of electrodes for an electroluminescent display may be found in the above-referenced U.S. Pat. No. 5,703,436.

The electrodes of the electrode layers 26 and 28 include transparent electrodes, and may include fully or partially opaque electrodes. Thus the electrodes may include commonly-known transparent conducting oxides, such as indium tin oxide (ITO). It will be appreciated that other metal oxides may be employed, such as indium oxide, titanium oxide, cadmium oxide, gallium indium oxide, niobium pentoxide, and tin oxide. In addition to a primary oxide, the electrodes may include a secondary metal oxide such as an oxide or cerium, titanium, zirconium, hafnium, and/or tantalum. The possible transparent conductive oxides include $ZnO_2$, $Zn_2SnO_4$, $Cd_2SnO_4$, $Zn_2In_2O_5$, $MgIn_2O_4$, $Ga_2O_3$—$In_2O_3$. The electrodes may be suitably arranged to form a plurality of picture elements (pixels). The electrodes may be formed, for example, by low temperature sputtering or direct current sputtering techniques (DC-sputtering or RF-DC sputtering), followed by selective removal of material. In some addressing schemes, the electrodes are sequentially and repeatedly scanned at a rapid rate to provide moving images similar to television images. This requires "refreshing" the display at short time intervals to rapidly turn pixels on and off.

Example materials for opaque electrodes include copper or aluminum. Other possible electrodes are elemental metal electrodes (opaque or transparent) that contain silver, aluminum, copper, nickel, gold, zinc, cadmium, magnesium, tin, indium, tantalum, titanium, zirconium, cerium, silicon, lead, palladium, or alloys thereof. Metal electrodes on plastic film have the advantage of higher conductivity than ITO electrodes on film.

The back electrode assembly 14 may include an acrylic or other hard internal protective layer to facilitate laser ablation of the back electrodes. As described in further detail below, laser light such as excimer laser light may be used to pattern the back electrodes. The internal protective layer may be a coating to prevent laser light penetrating and damaging functional layers between the internal protective layer and the back substrate 24. Acrylic, like other organic polymers, has a relatively low thermal conductivity, thereby minimizing lateral damage in ablation that may accompany the laser ablation to pattern the back electrodes 28. It will be appreciated that other suitable materials, such as other suitable polymers, may alternatively be included in the internal protective layer.

The back electrode assembly 14 may include a barrier coating, such as a multilayer barrier coating, to prevent contaminants, such as water and/or moisture, from entering. The moisture and oxygen barrier may be a conventional suitable material, such as $SiO_2$. Alternatively, the barrier may be $SiO_x$, where $1<x<2$. Using $SiO_x$ instead of $SiO_2$ may provide an additional moisture and oxygen barrier for the display 10, better preventing moisture and oxygen from being transported through the display. The value x for the $SiO_x$ may be controlled, for example, by controlling the oxide ratio in the material used in sputtering the oxide layer, by adding oxygen to an SiO material. As another alternative, a metal film or film-foil laminate, for example a copper or aluminum foil, may be used as a barrier. As still another alternative, the material for the back substrate 24 may be selected to act on its own as a suitable moisture and oxygen barrier. Thus the need for a separate moisture and oxygen barrier may be avoided entirely. For example, a glass front substrate may be sufficiently impermeable to moisture and oxygen to function on its own as a barrier.

The back electrode assembly 14 may be opaque. The opaqueness of the back panel 14 may accomplished in any of a variety of way. For example, the back substrate 24 may be made of an opaque material, such as a suitable opaque polymer material, for example one of the transparent polymer materials discussed above to which a dye or other pigmentation is added. Alternatively, the back substrate 24 may include the opaque material layer, which may be a polymer which is the same as or different from the transparent polymer of the remainder of the back substrate 24.

Alternatively or in addition, as noted above, the electrode material for the back electrodes 28 itself may be opaque. For example, the electrode material may be aluminum or copper, which is opaque when deposited on the polymer substrate material. The depositing of the electrode material may be by sputtering, for example. It will be appreciated that a suitable opaqueness may alternatively be achieved by printing an opaque ink between all or a portion of the back substrate 24 and the back electrodes 28.

One or both of the substrates 22 and 24 may have any of a variety of suitable protrusions therein. The protrusions may have any of a variety of suitable shapes, for example being posts or ribs, and for example forming wells on one or both of the substrates.

It will be appreciated that the illustrated embodiments are only examples, and that a wide variety of other suitable configurations may be employed.

Turning now to FIG. 3, the bottom electrode assembly 14 is illustrated in greater detail, with a conceptual view of its hierarchical control arrangement 50. The hierarchical control arrangement 50 is used to operatively couple electrodes 52 to external connections, such as conductive pads 56. The conductive pads 56 are used to couple the bottom electrode assembly 14 to external devices such as an external power source, a ground, and/or a means for providing data for selective activation of the electrodes 52 (e.g., a processing unit of a computer). The hierarchical control arrangement 50 includes high-level control elements 60 and low-level control elements 62. The control elements of the hierarchical control arrangement 50 are coupled to one another and to the electrodes 52 and the external connections 56 by an array of metal traces 66. As described further below, electrodes 52, the conductive pads 56, and/or the traces 66, may be formed and may be coupled to the control elements of the hierarchical control arrangement 50, by means of conventional, well-known lithographic processes.

In the hierarchical control arrangement 50, the high-level control elements 60 are coupled to one another and to one or more of the external connections 56. Each of the high-level control elements 60 is coupled to respective groups of the low-level control elements 62. Each of the low-level control elements 62 is in turn coupled to a respective subset of the electrodes 52. Thus, for example, each of the high-level control elements 60 may be coupled to a given number of the low-level control elements 62, for example being coupled to four of the low-level control elements, with each of the low-level control element 62 in turn coupled to a given number of the electrodes 52, for example being coupled to eight electrodes. It will be appreciated that the hierarchical control arrangement 50 may operate to reduce the number of control elements which a signal passes through between the external connections 56 and various of the electrodes 52, as compared to a single-level array of control elements.

The high-level control elements 60 may all be substantially identical to one another. Similarly, the low-level control element 62 may all be substantially identical to one another. The high-level control elements 60 may be of a different type than the low-level control elements 62 for example having different configuration, size, and/or functionality. Alternatively, it will be appreciated that the high-level control elements may be substantially identical to the low-level control element 62. Further, it will be appreciated that the high-level control element 60 and/or the low-level control element 62 may include non-identical control elements.

The hierarchical control arrangement 50 and the control elements 60 and 62 may be configured such that a variety of control signals may be sent for selectively activating or deactivating one or more of the associated electrodes. For example, signals may be sent to activate or deactivated individual of the pixels of the display. As another example, a signal or signals may be sent to activate or deactivate an entire row or column of pixels. As a third example, the control arrangement 50 may be configured such that a single signal clears the entire display.

Referring to FIG. 3A, the bottom electrode 14 may have multiple flexible layers 67, 68, and 69 for providing electrical connection to the control elements 60 and 62. For example, the first flexible layer 67 may include transparent electrodes and transparent interconnects for coupling each electrode to its respective interconnect on its respective low-level control element 60. The first flexible layer 67 may also include vias to allow electrical connection between the control elements 60 and 62, and electrical interconnects in overlying flexible layers, such as the layers 68 and 69. The overlying layers 68 and 69 may include other electrical interconnects, for example for coupling the low-level control elements 60 to their corresponding high-level control elements 62, or for coupling various of the high-level control elements 62 together. There may be overlap between interconnects of the different layers.

The flexible layers 67, 68, and 69 may be flexible tape automated bonding (TAB) tapes with conductive interconnects on them. For example, the flexible layers 67, 68, and 69 may be made of a flexible material, such as a flexible plastic, for example including a material selected from the group of polyether sulfone (PES), polyethylene terephthalate, polycarbonate, polybutylene terephthalate, polyphenylene sulfide (PPS), polypropylene, aramid, polyamide-imide (PAI), polyimide, nylon material (e.g., polyamide), aromatic polyimides, polyetherimide, acrylonitrile butadiene styrene, and polyvinyl chloride. The electrical interconnects on the flexible layers 67, 68, and 69 may include common materials such as aluminum, copper, gold, silver, conductive organic compounds, or other organic materials such as indium tin oxide. A typical thickness for the conductive interconnects is from 1000 Angstroms to 1 micron. The conductive interconnects, including the layers of conductive material and the vias (with the associated conductors running therethrough), may be created by various suitable known techniques for applying conductive films and patterning these films onto surfaces or into vias. For example, techniques used for creating tape automated bonding (TAB) tape in the semiconductor industry may be used to create flexible interconnect layers. Tape automated bonding is a known method of making connections to the interconnection pads of integrated circuits, in which a length of flexible material ("tape") carries a series of interconnection arrays. Each array includes a number of etched metal leads, each of the leads being arranged for bonding with a respective interconnection pad of a circuit. The bond between each beam and interconnection pad may be made via a terminal (known as a "bump") that is formed either on the interconnection pad or at a corresponding location on the lead. The use of TAB tape facilitates automation of the bonding process. Further information regarding TAB tapes may be found for example in U.S. Pat. No. 5,223,321, the entire disclosure of which is incorporated by reference.

Each of the flexible layers 67, 68, and 69 may be separately fabricated, and then sequentially deposited on one another, and then applied to the substrate 24. Alternatively, the first flexible layer 67 may be initially applied to the substrate 24, with the overlying flexible layers 68 and 69 then applied thereupon.

Further details regarding the configuration and methods of forming the electrodes may be found in the above-referenced International Publication Nos. WO 00/46854, WO 00/49421, WO 00/49658, WO 00/55915, and WO 00/55916.

It will be appreciated that other substrates and/or means of adhering control elements may be utilized. For example, control elements may be bonded or otherwise coupled to a glass display substrate using well-known chip on glass (COG) techniques. One example of such COG techniques may be found in U.S. Pat. No. 5,726,726, the entire disclosure of which is incorporated by reference. It will be appreciated that other suitable methods for producing flat displays, for example including glass substrates, may alternatively be utilized.

The control elements 60 and 62 may be microstructure elements. An exemplary microstructure element 70 is illustrated in FIG. 4. The microstructure element 70 has a semiconductor body 72, for example being made out of silicon. The semiconductor body 72 has beveled edges 74 and 76, cut for example at an angle of 54.7 degrees relative to a top surface 80 and a bottom surface 82 of the semiconductor body. The microstructure element 70 thus has trapezoidal-shaped cross-sections along its major axes, with the top surface 80 larger than the bottom surface 82. The microstructure element 70 has contacts 88 (also referred to as "connection points") along the top surface 80, the contacts providing a means for electrical connection to buried electronic elements, such as a suitable combination of field effect transistors (FETs) and capacitors, within the semiconductor body 72. Thus the microstructure element 70 may include a simple microprocessor, such as a four-bit microprocessor with a limited command set. The contacts 88 allow power, data, etc., to be input into and output out of the buried microprocessor.

Although the control elements 60 and 62 may themselves be rigid, the flexible substrates 22 and 24 with the control elements therein may still be flexible because the control elements may be small compared to the size of the substrate and to the amount the substrate flexes.

The microstructure element 70 may be symmetric in that its configuration may be the same if it is rotated by a multiple of 90 degrees about an axis running from the top surface 80 to the bottom surface 82. More broadly, the microstructure element may be functionally symmetric over a plurality of rotational orientations, thus enabling the microstructure element 70 to have a predetermined function independent of the orientation of the microstructure element when mounted in a correspondingly-shaped recess, such as a recess in the substrate 24. For example, microstructure elements may have any of a variety of polygonal shapes having symmetry, such as a triangles, squares, rectangles, parallelograms, pentagons, or hexagons. Thus both the semiconductor body 72 and the contacts 88 may be symmetric regarding such rotation. The semiconductor body 72 may have a substantially square shape.

Microstructure elements for use as control elements 60 and 62 may be small, for example, having a maximum width of about 200 microns or less. Two sizes of microstructure elements may be employed. In an exemplary embodiment the high-level control element 60 may have a width of 185 microns, and the low-level control element 62 may have a width of 77 microns. The different sizes of microstructure elements may have different designs and/or different modes of operation. It will be appreciated that the sizes given above are only examples, and that the microstructure elements may be have one or more of a wide variety of sizes. Further, it will be appreciated that alternatively or in addition, high-level microstructure elements may have a different shape than low-level microstructure elements.

As explained in greater detail below, microstructure elements for use as the control elements 60 and 62 may be deposited in corresponding recesses in the substrate 24 by a fluid self-assembly (FSA) process, in which one or more slurries containing the microstructure elements are flowed over the substrate, with the microstructure elements settling into the corresponding recesses in the substrate. Where different sizes of microstructure elements are employed, the sizes may be selected such that the larger microstructure elements are too large to fit into the recesses intended for the smaller microstructure elements, and such that any of the smaller microstructure which would fall into the recesses intended for the larger microstructure elements would be swept out of such recesses by hydrodynamic forces generated by the flow of the slurry over the substrate.

Figure 5:
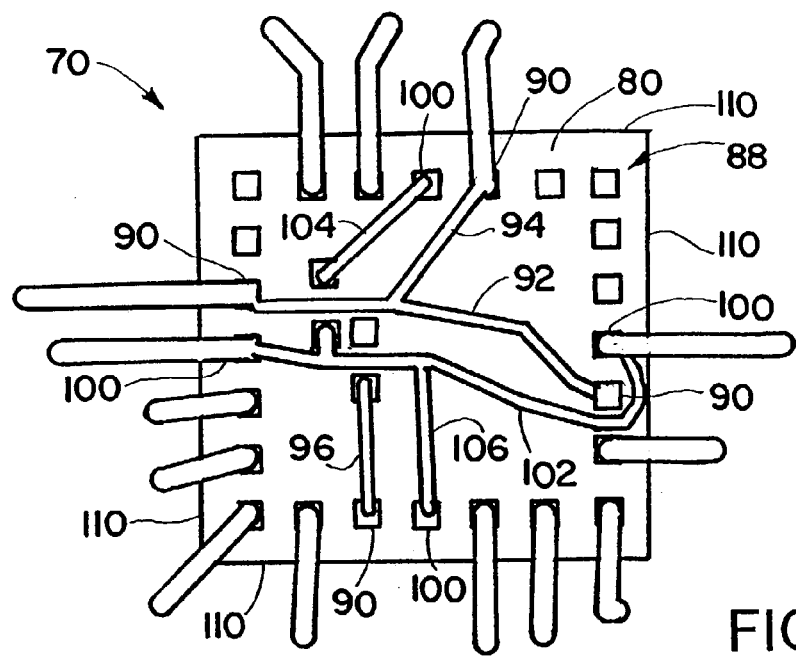
FIG. 5 is a plan view of the microstructure element of FIG. 4.

FIG. 5 is a plan view of the microstructure element 70, illustrating an example of connections between various of the contacts 88 to enable the microstructure element 70 to function substantially identically regardless of the orientation of the microstructure 70 within a corresponding recess. A first set 90 of the contacts 88 are electrically connected to one another by means of conductive traces or connections 92, 94, and 96. Similarly, a second set of contacts 100 are electrically conducted to one another by means of conductive traces or connections 102, 104, and 106. Each of the first set of contacts 90 is at the same location along respective of sides 110 of the top surface 80 of the microstructure element 70. Similarly, each of the second set of contacts 100 is correspondingly oriented along respective of the sides 110. Thus, by electrically coupling the sets 90 and 100 of the contacts 88 together, operation of the microstructure element 70 is substantially the same, regardless of which of the first set 90 and which of the second set 100 of the contacts are connected to an external device or devices. In other words the microstructure element 70 will have substantially the same operation for any orientation of it within a correspondingly-shaped recess.

As can be seen in FIG. 5, the conductive traces may be laid out so as to minimize the need for passing one of the traces over or under another of the traces. This simplifies manufacture of the microstructure elements. It will be appreciated that the layout of the conductive traces shown in FIG. 5 is merely exemplary, and that a variety of suitable other layouts may alternatively be employed.

It will be appreciated that the microstructure element 70 may be operatively configured to detect its orientation by determining which of the contacts 88 are receiving one or more types of signals. Further, the microstructure element 70 may be configured such that once it has determined its orientation, it may be able to suitably adjust its operations.

Further details regarding microstructure elements may be found in the above-referenced International Publication Nos. WO 00/46854, WO 00/49421, WO 00/49658, WO 00/55915, and WO 00/55916.

Figure 6:
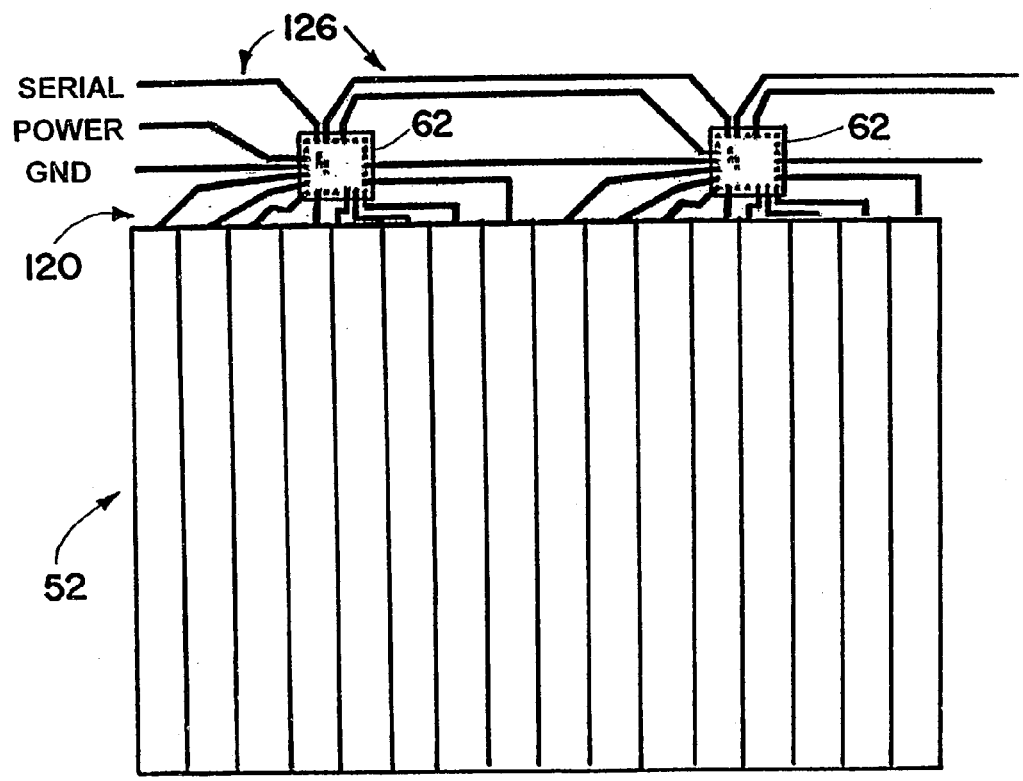

FIG. 6 shows an example of low-level connections of the hierarchical control arrangement 50. Each of the low-level control element 62 is operatively coupled to a respective set of the electrodes 52. In the illustrated embodiment, each of the low-level control element 62 is coupled to eight of the electrodes 52. However, it will be appreciated that each low-level control element may be coupled to a larger or smaller number of elements. Further, it will be appreciated that alternatively different of the low-level control element 62 may be coupled to a different number of the electrodes 52, if desired.

The low-level control elements 62 are coupled to the electrodes 52 by means of an array of conductive paths, such as element-electrode conductive traces 120. Serial, power, and reference voltage (ground) connections are made to the low-level control elements 62, from the high-level control elements 60, via conductive traces 126, which also make connections between various of the low-level control element 62. The conductor traces 120 and 126, and/or the electrodes 52, may be formed by selective etching of a deposited metal layer, as described in further detail below. Serial control signals are provided to the low-level control elements 62 to signal which of the low-level control elements are to provide power to their corresponding electrodes, and to which of the electrodes they are to provide power to. Thus a signal connection from one of the high-level control elements 60 is passed between various low-level control elements 62, and is used to selectively provide power to desired electrodes of the electrodes 52.

FIG. 7 shows an expanded view is shown of the hierarchical control arrangement 50 for selectively providing power to various of the column electrodes 52. The conductive pads 56 are used to provide power, reference voltage (ground), and clock and data signals to the high-level control element 60. The conductive pads 56 include a ground pad 132, and clock or signal pads 134 and 136, and a power pad 138. The conductive pads 56 are operably coupled to one or more devices that are external of the display device 10, such as a power source and a processor or controller for generating signals to selectively activate one or more of the column electrodes 52. As shown in FIG. 7, only four conductive pads are required for external electrical connection. The pads may thus be rather large, facilitating manufacture and connection to external devices.

Pad-element traces 140 electrically couple the conductive pads 56 to one of the high-level control elements 60. Conductive traces 144 are used to serially couple together the high-level control elements 60. In addition, conductive traces 150 are employed to connect the high-level control element 60 with corresponding groups of low-level control element 62. Through this arrangement power and ground are provided to all of the control elements of the hierarchical control arrangement 50, from the conductive pads 56 through the high-level control element 60, to the low-level control element 62.

Data signals for selectively providing power to one or more of the column electrodes 52 are similarly passed to the hierarchical control arrangement 50 (FIG. 3). The data signals may be control signals such as synchronous data clock signals. The data signals are passed from the conductive pads 56 through the high-level control element 60. The data signals cause one or more of the high-level control element 60 to pass a signal along to a group of low-level control element 62 which correspond to the respective high-level control element. The signal which is passed along to the corresponding low-level control element 62 in turn signals one or more of the corresponding low-level control elements to provide power to one or more of respective sets of the column electrodes 52 which are operatively coupled to that low-level control element.

The hierarchical control arrangement 50 shown in FIG. 7 has significant advantages over a single-level control arrangement which has a large number of control elements coupled together in series. The advantages of the hierarchical control arrangement 50 stem from the data signals and power having to pass through fewer control elements. In a single-level arrangement, a signal to activate an electrode at the farthest point from the conductive pads must pass through every intervening control element. This may be impractical, both in terms of the time required to pass through all of the control elements, and in terms of the voltage drop that necessarily occurs when passing through a control element. By contrast, in a hierarchical control arrangement, a data signal for activating the electrode farthest from the conductive pads need only pass through the high-level control elements 60, and those of the low-level control elements 62 which correspond to the last of the high-level control elements 60. There are far fewer high-level control elements in a hierarchical control arrangement than there would be total control elements in a single-level arrangement. For example, in the embodiment illustrated in FIG. 7, there are four corresponding low-level control elements 62 for each of the high-level control element 60. Therefore, comparing this to a corresponding single-level arrangement, a data signal for activating the farthest electrode would pass through approximately one-fourth the number of control elements. This could be accomplished with approximately one-fourth the voltage drop and in approximately one-fourth the time, therefore effectively quadrupling the speed of the device. The benefits of increased speed may be especially important in speed-critical applications, for example in displaying video signals.

Turning now to FIG. 8, a hierarchical control arrangement 150 is illustrated for use in selectively providing power to one or more of a plurality of row electrodes 152. Conductive pads 154 provide power, reference voltage (ground), and clock and/or data signals for selectively providing power to one or more of the row electrodes 152 via the hierarchical control arrangement 150, which includes high-level control elements 160 and low-level control elements 162. Suitable conductive connects, such as conductive traces, may be used to suitably electrically couple the conductive pads 154, the control elements 160 and 162, and the row electrodes 152. The connections and operation of the hierarchical control arrangement 150 may be similar to those of the hierarchical control arrangement 50 described above for selectively actuating the column electrodes 52.

The conductive traces used for coupling the various elements shown in FIGS. 7 and 8 may be produced using lithographic means, as described in greater detail below. In addition, the conductive pads and the electrodes themselves may also be formed by lithographic means, either in the same step as is used to form the conductive traces, or in a different step or steps.

The conductive pads 56 of the column electrode assembly and the conductive pads 154 of the row electrode assembly may be located so that they overlap when the display device 10 is assembled. This overlapping may facilitate simplified connection of the display device to external devices such as a power supply and a controller. It would be appreciated that the relatively large size of the conductive pads 56 and 154 allows a lower tolerance to be used in connecting them, since the conductive pads 56 will overlap the conductive pads 154 to some extent even if there is some misalignment of the two sets of conductive pads. The conductive pads 56 may be electrically coupled to the conductive pads 154 by use, for example, of a suitable conductive paste.

FIG. 8A shows an alternative hierarchical control arrangement 180 on a substrate 182. The control arrangement 180 includes, on the substrate 182, both a row control arrangement 184 for controlling row electrodes 186, and a column control arrangement 190 for controlling column electrodes

192. A display material (not shown) is between the electrodes as continuous sheet, or as discrete display material elements corresponding to one or more pixels of the display. In addition, an insulator may be placed between the row electrodes 186 and the column electrodes 192, to prevent shorting. The control arrangements 184 and 190 may be similar in details to the corresponding control arrangements 50 and 150 described above. Conductive pads 196 may be provided for external electrical connections. The conductive pads 196 may be coupled to both the row control arrangement 184 and the column control arrangement 190.

Figure 9:
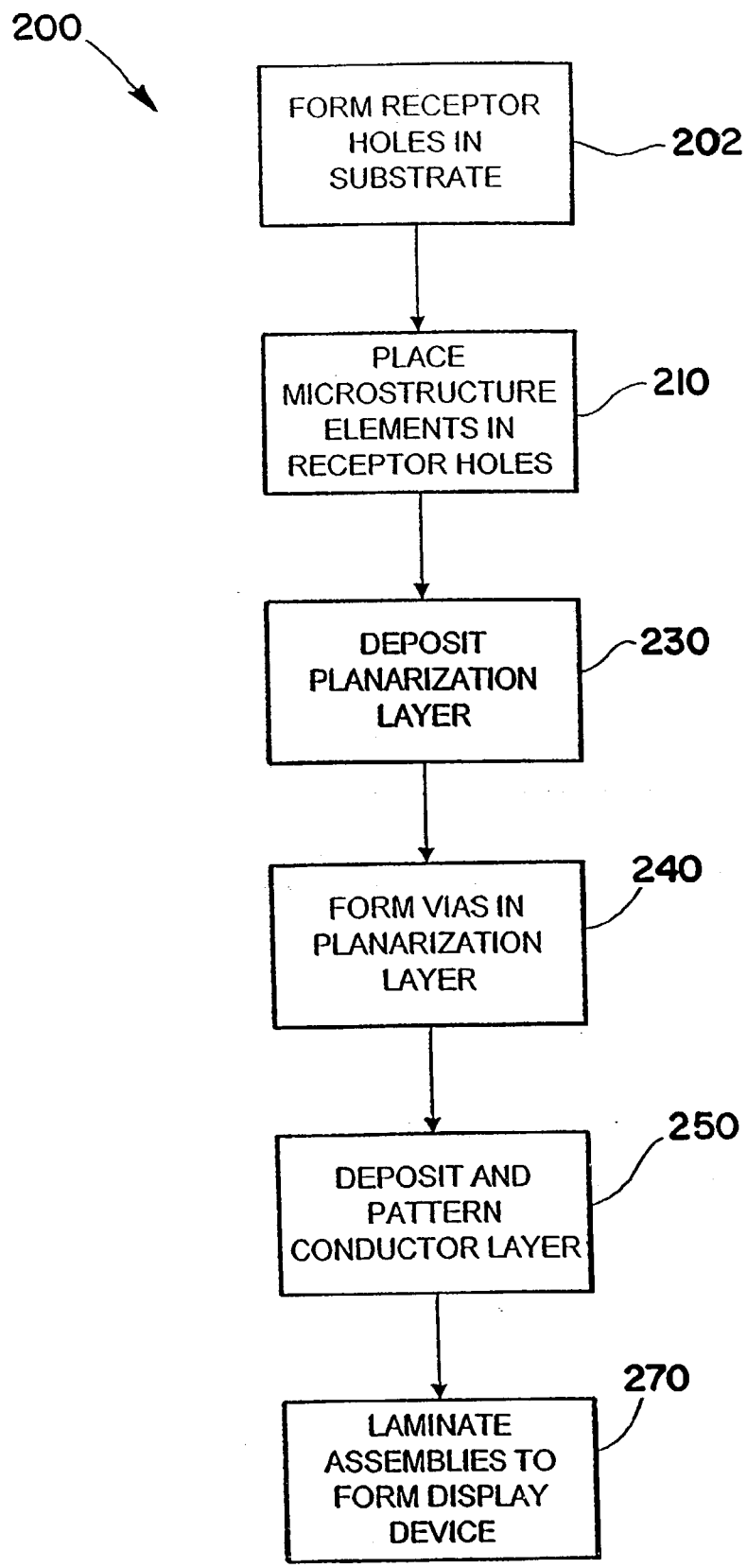
FIG. 9 is a high-level flow chart for a method for constructing the display device of FIG. 1.

Turning now to FIG. 9, a flow chart shows steps for a method 200 of producing the display device 10 shown and described above.

Figure 10:
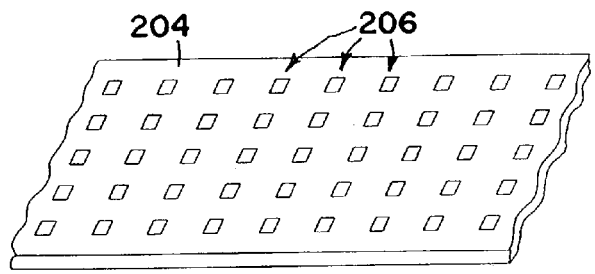
FIGS. 10–16 illustrate various of the steps of the method of FIG. 9.
Figure 11:
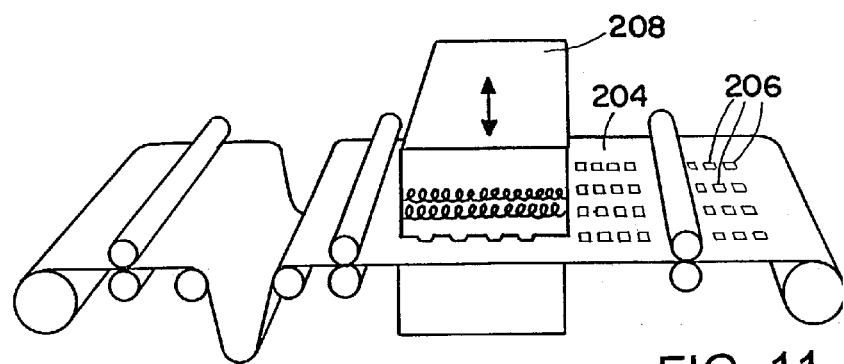

In step 202 of the method 200, as illustrated in FIGS. 10 and 11, a substrate material 204 has suitable receptor holes or recesses 206 formed therein. The receptor holes preferably have a suitable shape or shapes for receiving the control elements such as the microstructure element 70 shown in FIG. 4 and described above. The substrate material 204 may be a flexible plastic material, and the receptor holes 206 may be formed in the substrate material 204 by a roll process such as is illustrated in FIG. 11, wherein a heated press 208 is used to stamp the receptor holes in the substrate. Further details regarding roll processes, such as roll-to-roll manufacturing techniques, may be found in U.S. Pat. No. 6,067,016, which is incorporated herein by reference in its entirety.

It will be appreciated that alternatively other substrate material and/or other methods of forming receptor holes therein, may be utilized. For example, the holes may be stamped, molded, etched, or laser drilled, with a suitable method being selected based on the substrate material used. A preferred process for forming holes of precise shape and location in plastic substrates, is the continuous micro-embossing process disclosed in U.S. Pat. Nos. 4,478,769; 4,601,861; and 4,633,567; the entire disclosures of which are incorporated by reference. As another alternative, a suitable embossing process for embossing rigid substrates may be used to form the arrangement of holes (recesses). Further details regarding embossing of rigid materials may be found in commonly-assigned, co-pending U.S. patent application Ser. No. 09/596,240, entitled "A Process for Precise Embossing", filed Jun. 6, 2000, and in International Application PCT/US01/18655, filed Jun. 8, 2001. Both of these applications are incorporated herein by reference in their entireties.

Figure 12:
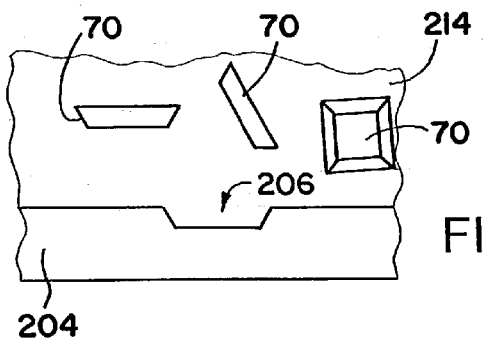

In step 210 microstructure elements are placed in the receptor holes 206 of the substrate material 204. The placement of the microstructure elements 70 in the receptor hole 206 may be accomplished by a fluid self-assembly (FSA) process, such as the FSA process illustrated in FIGS. 12 and 13. In the FSA process a large number of the microstructure elements 70 are added to a fluid, creating a slurry 214. The slurry is sprayed on or otherwise flowed over the substrate material 204. As the slurry 214 flows over the substrate 204, by chance some of the microstructure elements 70 fall into the receptor holes 206. Once one of the microstructure elements 70 falls into one of the receptor holes 206, the microstructure element is retained in the close-fitting receptor hole by hydrodynamic forces. Further details regarding FSA processes may be found in U.S. Pat. Nos. 5,545,291 and 5,904,545, the entire disclosures of which are herein incorporated by reference. After the FSA process the substrate 206 may be checked for empty recessed regions, for example using an electronic eye attached to a machine capable of viewing the surface of the substrate material. Empty recessed regions may be filled, for example by using a robot to place a control element therein.

Figure 13:
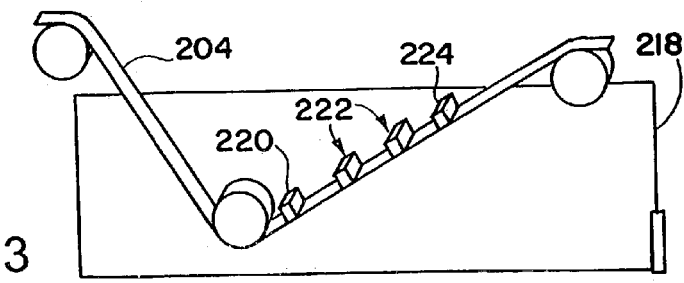

As illustrated in FIG. 13, the FSA process may be performed as a roll operation by pulling the substrate material 204 through a bath of the slurry 214. Vacuum devices 220 and 224 may pull excess fluid and/or impurities off the substrate material 204 at the start and end of the FSA process. Spray devices 222 may be utilized to spray the slurry 214 onto the substrate material 204. The rate at which the slurry 214 is sprayed onto the substrate material 204 may be such that the number of microstructure elements 70 flowing past any given area of the substrate material 204, is several times (e.g., seven times) the number of the receptor holes 206 in that area of the substrate material 204. An excess number of the microstructure elements 70 may be required in order to obtain full filling of the receptor holes 206. The slurry 214 with excess of the microstructure elements 70 may generally be reused, since the microstructure elements generally do not suffer damage by collision with the substrate material 204 or with each other, due to hydrodynamic forces.

An FSA process may be used for filling receptor holes of two different sizes with microstructure elements of two different sizes, the microstructure elements of one size for example having a different design or function than the microstructure elements of the other size. For filling operations with two different sizes of holes, it will be appreciated that the larger microstructure elements are unable to fit into the smaller receptor holes, and that hydrodynamic forces tend to cause the smaller microstructure elements to be pulled out of any of the larger receptor holes that the smaller microstructure elements happen to fall into. If microstructure elements of different sizes are employed, a slurry containing microstructure elements of one size may be sprayed on the substrate material 206 from a different of the spray devices 222 than the spray device 222 that is used to spray a slurry containing microstructure elements of another size.

Figure 14:
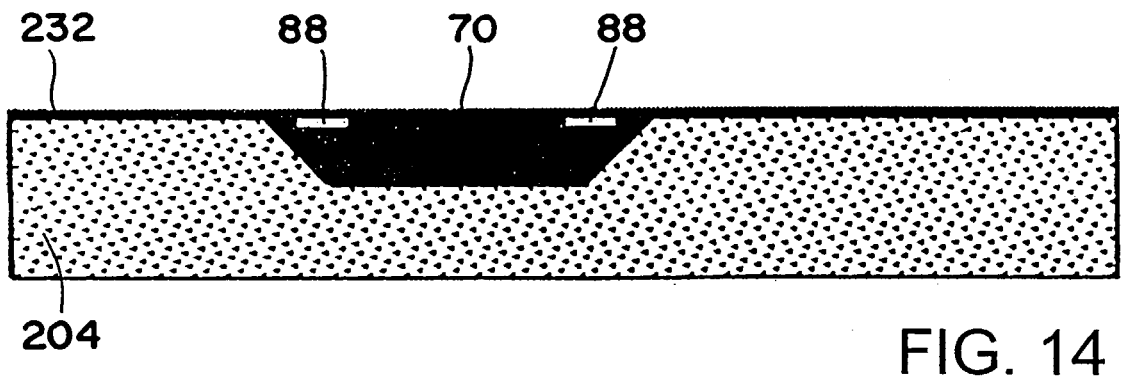

Thereafter in step 230, illustrated in FIG. 14, a planarization layer 232 is deposited on top of the substrate material 204. The planarization layer 232 secures the microstructure elements 70 in place within the receptor holes 206, fills gaps between the microstructure elements and the substrate material 204, and provides a smooth upper surface for further operations.

Figure 15:
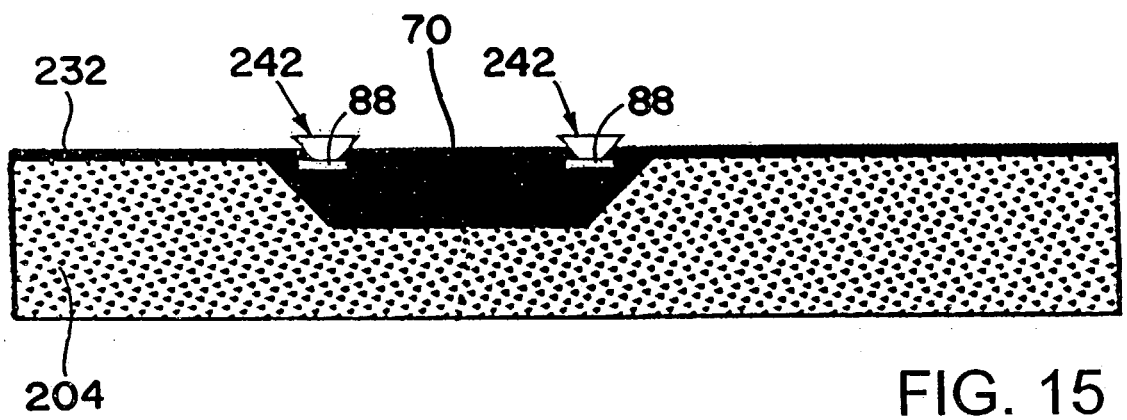

In step 240, vias 242 are formed in the planarization layer 232 to enable connections to be made with the contacts 88 of the microstructure element 70. The vias 242 are illustrated in FIG. 15, and may be formed by suitable etching processes, for example suitable photolithographic processes.

Figure 16:
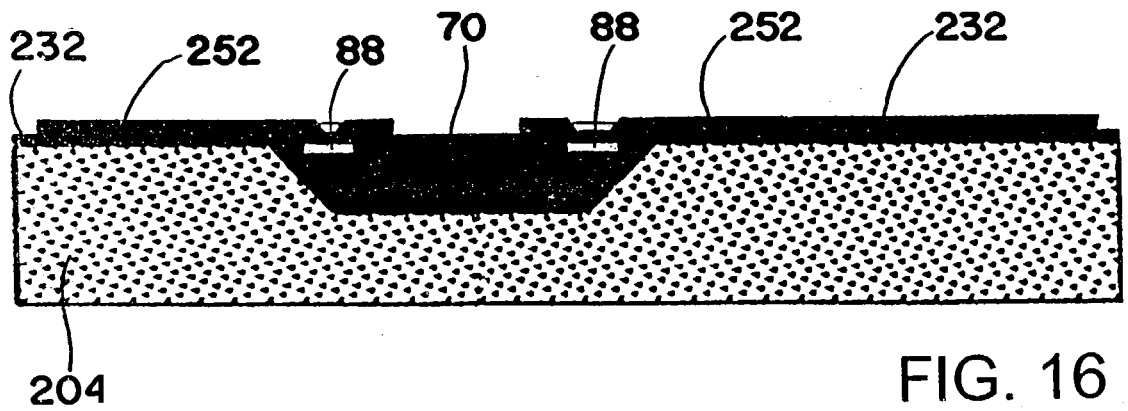

Thereafter, as illustrated in FIG. 16, in step 250 a conductor layer 252 is deposited and patterned selectively removed to form the conductor traces, conductive pads, and/or the electrodes, where desired. The depositing may be accomplished by a variety of well-known methods of depositing a conductor, such as a metal, for example chemical vapor deposition and sputtering. The selective removal of the conductive layer may be accomplished by any of a variety of suitable etching techniques, for example photolithographic techniques.

Finally, the display device 10 is laminated together in step 270, thus forming the device illustrated in FIG. 1. The lamination may be accomplished by any of a variety of well-known techniques. An example of a suitable method for laminating flexible substrates having row and column electrodes, such that the electrodes are in registered alignment, may be found in U.S. Pat. No. 5,062,916, the entire disclosure of which is herein incorporated by reference. Alternatively, it will be appreciated that the electrode assemblies may be joined to opposite sides of the liquid crystal material assembly 16 by any of a variety of other suitable techniques or processes.

It will be appreciated that the above-described display device 10 with hierarchical control arrangements, is but one example of the many applications for such hierarchical control arrangements. Moreover, it will be appreciated that many variations are possible on the hierarchical control arrangement described above, for example a hierarchical control arrangement having three or more levels.

Moreover, it will be appreciated that the method 200 described above is merely exemplary, and that hierarchical control arrangements and devices utilizing them may be fabricated using a wide variety of suitable methods. For example, interconnects, electrodes, and/or display material, such as LCD material, may be deposited onto flexible materials by a variety of suitable methods, including spraying, such as ink jet spraying, screen printing, and lithography and etching.

Displays of the sort described above may be coupled to other components as a part of a wide variety of devices, for display of various types of information. For example, a display may be coupled to a microprocessor, as part of a computer, cell phone, calculator, smart card, appliance, etc., for displaying information.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A flexible display, comprising first and second flexible electrode assemblies on opposite sides of a light emitting display material, wherein the first electrode assembly includes a plurality of row electrodes and the second electrode assembly includes a plurality of column electrodes, wherein the plurality of row electrodes and the plurality of column electrodes coupling to respective control elements placed in recesses formed on a substrate, and wherein for each of the electrode assemblies, the control elements include high-level control elements and low-level control elements arranged in a hierarchical control arrangement.

2. The flexible display of claim 1, wherein the electrode assemblies each include multiple conductive pads for external connection, the conductive pads operatively coupled to a control arrangement for selectively providing power to the electrodes.

3. The flexible display of claim 1, wherein the electrode assemblies each includes the substrate with the recesses and the respective control elements placed in the recesses.

4. The flexible display of claim 1, wherein the control elements are coupled to the plurality of row electrodes and the plurality of column electrodes through electrical interconnects.

5. The flexible display of claim 1, wherein the electrode assemblies each include a flexible substrate with one or more flexible layers thereupon, and wherein the one or more flexible layers include the electrodes and interconnects between the electrodes.

6. The flexible display of claim 1, wherein the electrode assemblies each include multiple conductive pads for external connection, the conductive pads operatively coupled to a control arrangement for selectively providing power to the electrodes.

7. The flexible display of claim 1, wherein the high-level control elements are a different size than the low-level control elements.

8. The flexible display of claim 1, wherein the high-level control elements are a different shape than the low-level control elements.

9. The flexible display of claim 1, wherein the control elements are shaped microstructures.

10. The flexible display of claim 1, wherein the control elements are placed in the recesses using fluidic self-assembly process.

11. A flexible display, comprising a flexible substrate, a plurality of row electrodes and a plurality of column electrodes attached to the substrate with a light emitting display material between the row electrodes and the column electrodes, the flexible substrate including recesses therein and a plurality of discrete control elements placed in respective recesses, wherein the control elements are operatively coupled to the electrodes and wherein the control elements include a first set of control elements operatively coupled to the row electrodes, and a second set of control elements operatively coupled to the column electrodes.

12. A flexible display, comprising a flexible substrate, a plurality of row electrodes of a first electrode assembly and a plurality of column electrodes of a first electrode assembly attached to the substrate with a light emitting display material between the row electrodes and the column electrodes, the flexible substrate including recesses therein and a plurality of discrete control elements placed in respective recesses, wherein the control elements are operatively coupled to the electrodes and wherein the electrode assemblies each include multiple conductive pads for external connection, the conductive pads operatively coupled to a control arrangement for selectively providing power to the electrodes, wherein the conductive pads of the first electrode assembly are aligned with the conductive pads of the second electrode assembly.

13. A flexible display, comprising first and second flexible electrode assemblies on opposite sides of a light emitting display material, wherein the first electrode assembly includes a plurality of row electrodes and the second electrode assembly includes a plurality of column electrodes, wherein the plurality of row electrodes and the plurality of column electrodes coupling to respective control elements placed in recesses formed on a substrate, wherein the electrode assemblies each include multiple conductive pads for external connection, the conductive pads operatively coupled to a control arrangement for selectively providing power to the electrodes, and wherein the conductive pads of the first electrode assembly are aligned with the conductive pads of the second electrode assembly.

14. A method of forming an electrode assembly, the method comprising:

attaching a plurality of control elements to a substrate;

coupling a plurality of electrodes to the substrate, the plurality of electrodes including a plurality of row electrodes and a plurality of column electrodes on opposite sided of a light emitting display material; and operatively coupling the control elements to the electrodes; and wherein the control elements include high-level control elements and low-level control elements arranged in a hierarchical control arrangement.

15. The method of claim 14, wherein the high-level control elements are a different size than the low-level control elements.

16. The method of claim 14, wherein the high-level control elements are a different shape than the low-level control elements.

17. A flexible display, comprising a flexible substrate, a plurality of row electrodes and a plurality of column electrodes attached to the substrate with a light emitting display material between the row electrodes and the column electrodes, the flexible substrate including recesses therein and a plurality of discrete control elements placed in respective recesses, wherein the control elements are operatively coupled to the electrodes and wherein the control elements include high-level control elements and low-level control elements arranged in a hierarchical control arrangement.

18. The flexible display of claim 17, wherein the high-level control elements are a different size than the low-level control elements.

19. The flexible display of claim 17, wherein the high-level control elements are a different shape than the low-level control elements.

\* \* \* \* \*